US008138864B2

(12) United States Patent
Mills et al.

(10) Patent No.: US 8,138,864 B2
(45) Date of Patent: Mar. 20, 2012

(54) CIRCUIT INTERRUPTER INCLUDING A MOLDED CASE MADE OF LIQUID CRYSTAL POLYMER

(75) Inventors: Patrick W. Mills, Bradenton, FL (US); Richard G. Benshoff, Sarasota, FL (US); James M. McCormick, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 479 days.

(21) Appl. No.: 12/475,730

(22) Filed: Jun. 1, 2009

(65) Prior Publication Data

US 2010/0301976 A1 Dec. 2, 2010

(51) Int. Cl.
*H01H 9/02* (2006.01)
*H01H 13/04* (2006.01)
*H05K 5/02* (2006.01)

(52) U.S. Cl. .......... 335/202; 335/106; 335/156; 174/51; 361/753; 361/796; 361/799

(58) Field of Classification Search .................. 335/106, 335/156, 202; 174/51; 361/753, 796, 799
See application file for complete search history.

(56) References Cited

U.S. PATENT DOCUMENTS 2,683,785 A * 7/1954 Miller ........................... 335/106
3,706,100 A * 12/1972 Halbeck et al. ............... 361/115
4,292,613 A * 9/1981 Bando et al. .................. 335/128
5,453,723 A * 9/1995 Fello et al. ....................... 335/18
5,763,824 A * 6/1998 King et al. ..................... 174/374
6,866,908 B2 * 3/2005 Lichtenstein et al. ....... 428/35.7
6,960,972 B2 * 11/2005 Nakamura et al. ............ 335/128
7,170,376 B2 1/2007 Mills et al.
2002/0158725 A1 * 10/2002 Nerstrom et al. ............... 335/17
2006/0125583 A1 6/2006 Mills et al.
2009/0027154 A1 1/2009 Mills et al.

OTHER PUBLICATIONS

Tuthill Corporation, "Insert Molding and Overmolding: Custom Molding @ Tuthill.com", http://www.tuthill.com/us/en/about/organization/lob/plastics/insert-molding-and-overmoldin . . . , Apr. 6, 2009, 1 p.
Vance, Jr., J., "Insert Molding", Medical Device & Diagnostic Industry Magazine, Apr. 1996, pp. 1-2.

* cited by examiner

*Primary Examiner* — Mohamad Musleh
(74) *Attorney, Agent, or Firm* — Bradley J. Diedrich; Kirk D. Houser

(57) ABSTRACT

A circuit interrupter includes a housing having a molded case made of liquid crystal polymer. Separable contacts are disposed within the housing. An operating mechanism is disposed within the housing and is structured to open and close the separable contacts. A trip mechanism is disposed within the housing and is structured to cooperate with the operating mechanism to trip open the separable contacts. The trip mechanism includes an electronic trip circuit and a rigid, conductive base providing a ground to the electronic trip circuit. The rigid, conductive base is insert molded to a portion of the molded case.

18 Claims, 6 Drawing Sheets

CIRCUIT INTERRUPTER INCLUDING A MOLDED CASE MADE OF LIQUID CRYSTAL POLYMER

BACKGROUND

1. Field

The disclosed concept relates to electrical switching apparatus and, more particularly, to circuit interrupters, such as, for example and without limitation, aircraft or aerospace circuit breakers including an electronic trip circuit, remote control circuit breakers, and remote power controllers.

2. Background Information

Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Subminiature circuit breakers are used, for example, in aircraft or aerospace electrical systems where they not only provide overcurrent protection but also serve as switches for turning equipment on and off. Such circuit breakers must be small to accommodate the high-density layout of circuit breaker panels, which make circuit breakers for numerous circuits accessible to a user. Aircraft electrical systems, for example, usually consist of hundreds of circuit breakers, each of which is used for a circuit protection function as well as a circuit disconnection function through a push-pull handle.

In many military applications, moisture resistance, vented and sealed units, and corrosion resistance are key attributes of modern aerospace circuit breakers, which seek to avoid failures resulting from arcing and/or dielectric breakdown. For example, if a molded circuit breaker case absorbs moisture or retains moisture from its molding process, then this could contribute to a premature product failure resulting from arcing and/or dielectric breakdown.

Military specification MIL-83383 for remote control circuit breakers (RCCBs) has dictated the use of thermoset compounds for the molded circuit breaker case.

U.S. Patent Application Publication No. 2009/0027154 discloses a circuit breaker including a trip indicator, which is preferably made of a suitable liquid crystal polymer (LCP), which provides suitable flexibility while also being suitably durable.

U.S. Pat. No. 7,170,376 discloses a circuit breaker housing and a trip circuit forming a composite structure. The housing halves are preferably made from liquid crystal polymer thermoplastic, which may be molded to provide relatively very thin walls (e.g., without limitation, less than about 0.010 in. (about 0.254 mm)) with an irregular wall thickness and a relatively complex geometry, thereby providing superior strength and temperature insulation characteristics. The housing halves also electrically and thermally insulate the arc fault detector (AFD) printed circuit board (PCB) electronics from the current carrying operating mechanism. Over-molding of the AFD PCB electronics provides structural and overall package integrity as may be employed, for example, for aerospace use. The PCBs are made of an FR4 electronics substrate having a thickness of about 0.018 inch.

Vance, Jr., J., "Insert Molding", Medical Device & Diagnostic Industry Magazine, April 1996, pp. 1-2, discloses that insert molding is an injection molding process whereby plastic is injected into a cavity and around an insert piece placed into the same cavity just prior to molding. The result is a single piece with the insert encapsulated by the plastic. The insert can be made of metal or another plastic. The technique was initially developed to place threaded inserts in molded parts and to encapsulate the wire-plug connection on electrical cords. There are two types of bonding that occur in insert molding, molecular and mechanical. Molecular bonding can occur when the insert material is the same as or similar to the encapsulating resin. This will yield the best results from the joint, both for physical strength and leak resistance. An example would be molding a polyurethane bifurcation to a polyurethane catheter. Mechanical bonding can take place in two ways, by the shrinking of the encapsulating resin around the insert as the resin cools, or by the surrounding of irregularities in the surface of the insert by the encapsulating resin. Although shrinkage always occurs, it is rarely sufficient to produce adequate physical strength or leak resistance of the joint. In general, when insert molding dissimilar materials, the insert should offer some means of mechanical retention such as a sandblasted, flared, or knurled surface.

Insert molding is also known as a process in which plastic is injected into a mold that contains an pre-placed insert. The result of insert molding is a single molded plastic piece with an insert surrounded by the plastic. Inserts can be made of metals or different types of plastic. Insert molding is used in many industries. Applications of insert molding include insert-molded couplings, threaded fasteners, filters, and electrical components.

There is room for improvement in circuit interrupters.

SUMMARY

These needs and others are met by embodiments of the disclosed concept, which provide a circuit interrupter including a molded case made of liquid crystal polymer in which a rigid, conductive base is insert molded to the molded case, or where such molded case includes a cavity structured as a mold to receive a number of printed circuit boards and a low pressure molding material to encapsulate the number of printed circuit boards within the cavity.

In accordance with one aspect of the disclosed concept, a circuit interrupter comprises: a housing comprising a molded case made of liquid crystal polymer; separable contacts disposed within the housing; an operating mechanism disposed within the housing and being structured to open and close the separable contacts; and a trip mechanism disposed within the housing and being structured to cooperate with the operating mechanism to trip open the separable contacts, the trip mechanism comprising an electronic trip circuit and a rigid, conductive base providing a ground to the electronic trip circuit, wherein the rigid, conductive base is insert molded to a portion of the molded case.

The molded case may include a first cavity, a separate second cavity and a wall separating the first cavity from the separate second cavity; the separable contacts and the operating mechanism may be disposed within the separate second cavity; and the electronic trip circuit may comprise a number of printed circuit boards disposed within the first cavity. The first cavity may be structured as a mold and may receive the number of printed circuit boards and a low pressure molding material to encapsulate the number of printed circuit boards within the first cavity.

The rigid, conductive base may include a planar portion disposed adjacent the molded case, the planar portion including a plurality of openings, the molded case including a plurality of protrusions disposed through the plurality of openings, in order to mechanically interlock the planar portion to the molded case when the rigid, conductive base is insert molded to the portion of the molded case.

The low pressure molding material may be a low pressure moldable polymide.

As another aspect of the disclosed concept, a circuit interrupter comprises: a housing comprising a molded case made of liquid crystal polymer, the molded case including a first cavity, a separate second cavity and a wall separating the first cavity from the separate second cavity; separable contacts disposed within the separate second cavity; an operating mechanism disposed within the separate second cavity and being structured to open and close the separable contacts; and a trip mechanism disposed within the housing and being structured to cooperate with the operating mechanism to trip open the separable contacts, the trip mechanism comprising a number of printed circuit boards disposed within the first cavity, wherein the first cavity is structured as a mold and receives the number of printed circuit boards and a low pressure molding material to encapsulate the number of printed circuit boards within the first cavity.

The low pressure molding material may be a low pressure moldable polymide.

As another aspect of the disclosed concept, a circuit interrupter comprises: a plurality of poles, each of the poles comprising: a housing comprising a molded case made of liquid crystal polymer, separable contacts disposed within the housing, an operating mechanism disposed within the housing and being structured to open and close the separable contacts, and a trip mechanism disposed within the housing and being structured to cooperate with the operating mechanism to trip open the separable contacts, the trip mechanism comprising an electronic trip circuit and a rigid, conductive base providing a ground to the electronic trip circuit, wherein the rigid, conductive base is insert molded to a portion of the molded case; and a plurality of fasteners coupling the plurality of poles together.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "to encapsulate" means to at least substantially surround a number of conductive or partially conductive structures by a number of insulative structures.

As employed herein, the statement that two or more parts are "coupled" together means that the parts are joined together either directly or joined through one or more intermediate parts.

The disclosed concept is described in association with a remote control circuit breaker (RCCB), although the disclosed concept is applicable to a wide range of circuit interrupters including, but not limited to, single-phase and plural-phase RCCBs, single-phase and plural-phase circuit breakers, and single-phase and plural-phase remote power controllers (RPCs). Such circuit breakers can be, for example and without limitation, subminiature circuit breakers, and aircraft or aerospace circuit breakers.

Figure 1:
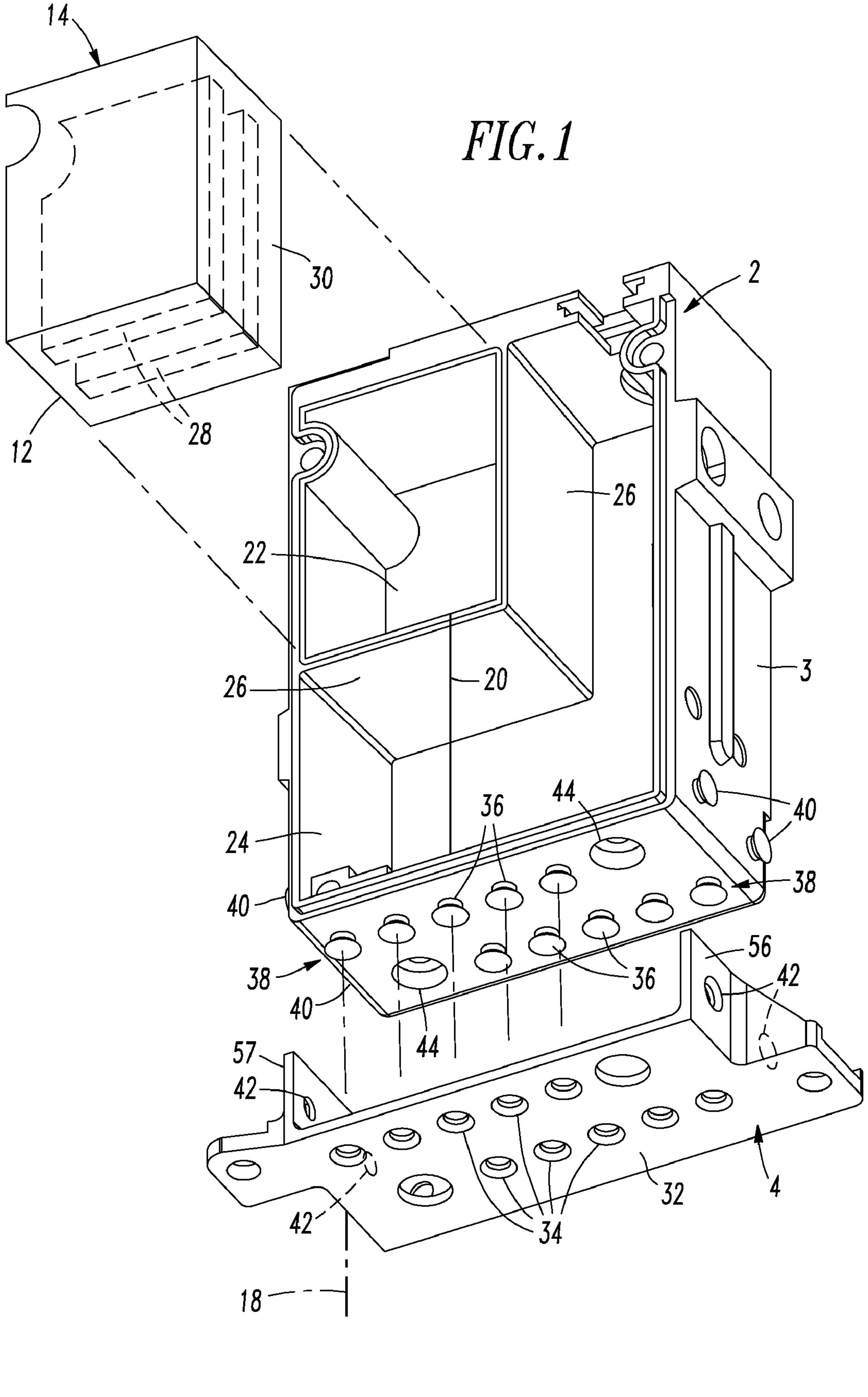
FIG. 1 is an exploded isometric view of a liquid crystal polymer case and an aluminum mounting base in accordance with embodiments of the disclosed concept.
Figure 2:
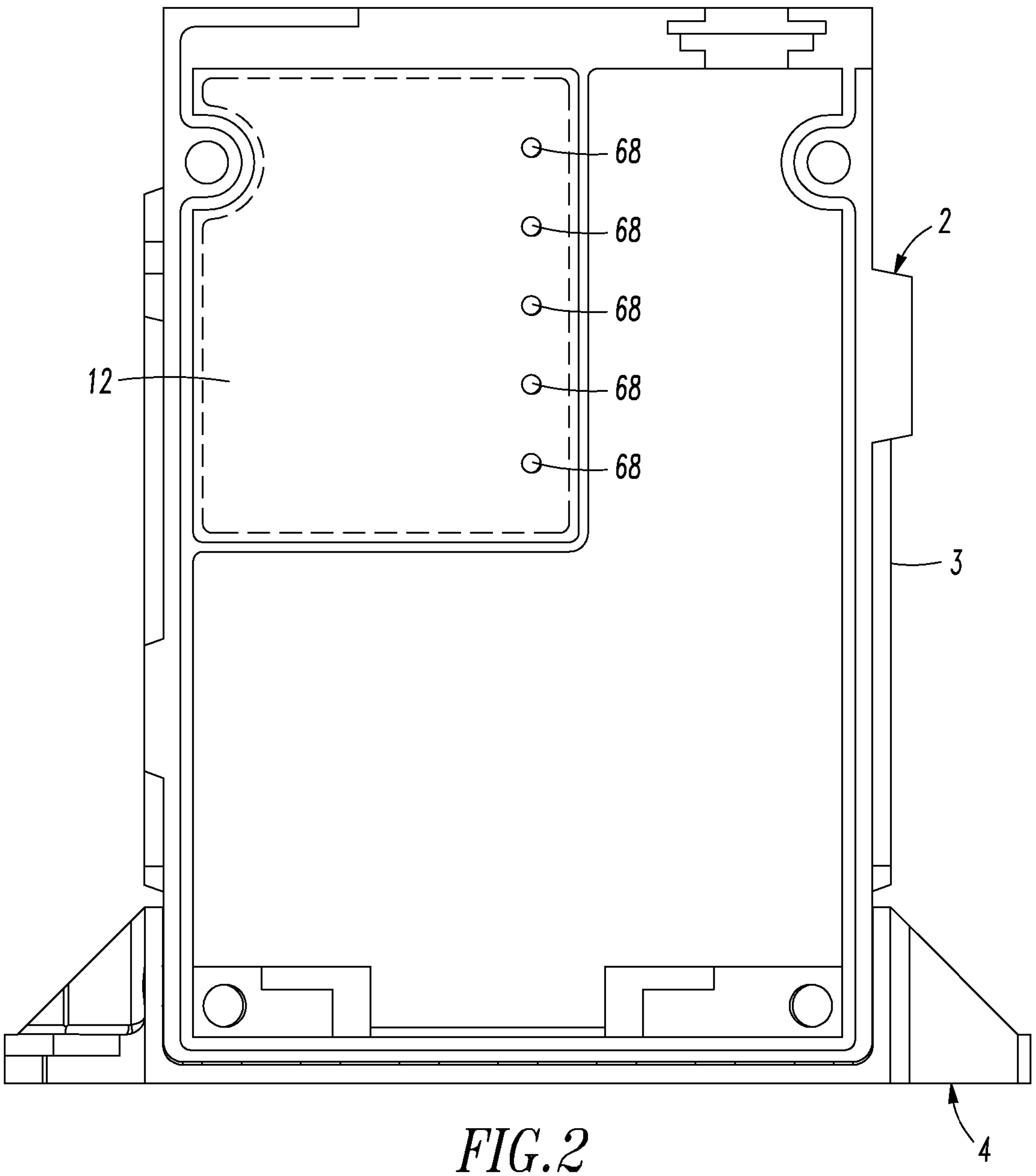
FIG. 2 is a vertical elevation view of the liquid crystal polymer case of FIG. 1.
Figure 3:
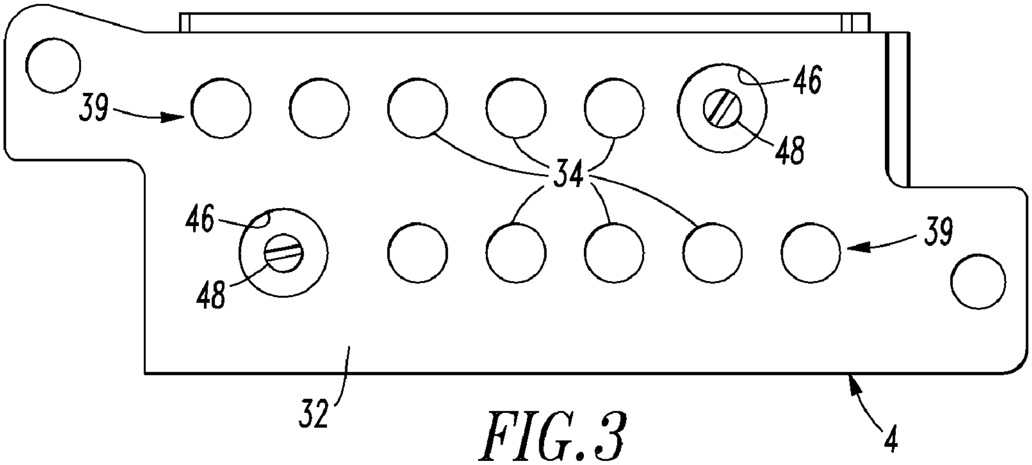
FIG. 3 is a bottom plan view of the aluminum mounting base of FIG. 1.

Referring to FIGS. 1 and 2, a housing 2 comprises a molded case 3 made of liquid crystal polymer (LCP). FIGS. 1-3 show a rigid, conductive base, such as an example aluminum mounting base 4, for the housing 2.

Figure 7:
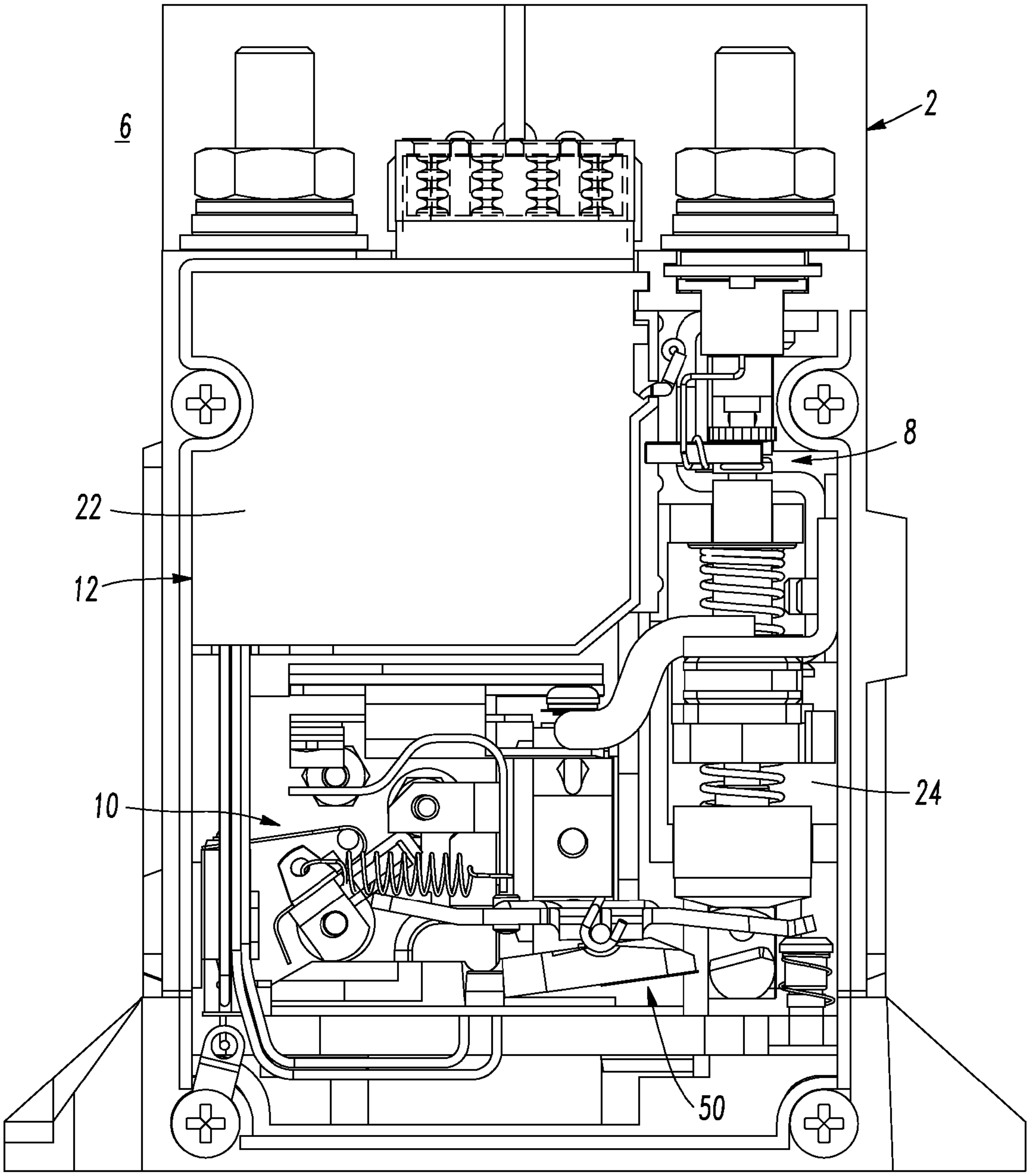
FIG. 7 is a vertical elevation view of a circuit interrupter including a liquid crystal polymer case and an aluminum mounting base in accordance with another embodiment of the disclosed concept.

Referring to FIG. 7, a circuit interrupter 6 includes the housing 2 of FIGS. 1 and 2. Separable contacts 8 are disposed within the housing 2. An operating mechanism 10 is disposed within the housing 2 and is structured to open and close the separable contacts 8. A trip mechanism 12 is disposed within the housing 2 and is structured to cooperate with the operating mechanism 10 to trip open the separable contacts 8.

Referring again to FIGS. 1-3, the trip mechanism 12 includes an electronic trip circuit 14. The example aluminum mounting base 4 provides a ground to the electronic trip circuit 14. As will be described, the example aluminum mounting base 4 is insert molded to a portion of the molded case 3. There is an external ground path 18 (shown in phantom line drawing) from an aircraft chassis (not shown) to the aluminum mounting base 4. There is an internal ground path 20 (e.g., without limitation, a wire or other suitable conductor) from the example aluminum mounting base 4 to the electronic trip circuit 14. Hence, the example external aluminum mounting base 4 is employed for the electronic grounding of the internal electronic trip circuit 14. This advantageously provides grounding without requiring a user to separately electrically connect an external ground wire to the circuit interrupter 6.

EXAMPLE 1

As shown in FIG. 1, the molded case 3 includes a first cavity 22, a separate second cavity 24 and a number of walls 26 (two example walls 26 are shown, although one, three or more walls could be employed) separating the first cavity 22 from the separate second cavity 24. As shown in FIG. 7, the separable contacts 8 and the operating mechanism 10 are disposed within the separate second cavity 24. The electronic trip circuit 14 can be formed from a number of printed circuit boards (PCBs) 28 (two example PCBs 28 are shown, although one, three or more PCBs could be employed) disposed within the first cavity 22. The first cavity 22 is structured as a mold and receives the number of PCBs 28 and a low pressure molding material 30 to encapsulate the number of PCBs 28 within the first cavity 22.

The low pressure molding material 30 can be, for example and without limitation, a suitable low pressure moldable polymide.

EXAMPLE 2

The circuit interrupter 6 (FIG. 7) can be, for example and without limitation, a circuit breaker, a remote control circuit breaker (RCCB), or a remote power controller (RPC).

EXAMPLE 3

The example aluminum mounting base 4 can be about 2.25 inches, by about 1.125 inches, by about 0.625 inches in size.

EXAMPLE 4

The example aluminum mounting base 4 includes a planar portion 32 disposed adjacent the molded case 3. The planar portion 32 includes a plurality of openings 34 (FIGS. 1 and 3). The molded case 3 includes a plurality of protrusions 36 (FIG. 1) disposed through the plurality of openings 34, in order to mechanically interlock the planar portion 32 to the molded case 3 when the aluminum mounting base 4 is insert molded to the portion of the molded case 3.

The cross-drilled openings 34 of the aluminum mounting base 4 mechanically interlock the molded case 3 to the aluminum mounting base 4 during the insert molding process. This occurs when the molding LCP plastic material fills/flows into the voids in the aluminum mounting base 4. In the bottom of the molded case 3, there are two example rows 38 of five of the protrusions 36 in the molded case 3 that interlock with two example rows 39 of five of the openings 34 in the aluminum mounting base 4. The protrusions 36 of the molded case 3 are disposed in the rows 38, with each of the rows 38 including a plurality of the protrusions 36. The openings 34 of the planar portion 32 are disposed in the rows 39, with each of the rows 39 including a plurality of the openings 34.

The example insert molding process consists of a suitably machined, metal injection molded or die-cast aluminum mounting base 4 that is "inserted/loaded" into a conventional thermoplastic molding press (not shown). The mold cavity precisely locates the aluminum mounting base 4. The mold core (or plug) (not shown) closes to define the molded geometry. The LCP plastic material fills the voided area within the mold, which includes the cross drilled openings 34 in the aluminum mounting base 4. The insert molding cycle is complete resulting in plastic mechanically interlocking the aluminum mounting base 4 to the molded case 3. The LCP material preferably requires no post secondary operations to become a final product, such as de-flashing or post moisture baking. This does not require epoxying of the aluminum mounting base 4 to the molded case 3.

EXAMPLE 5

There are also two example protrusions 40 and two example corresponding openings 42 on each side of the molded case 3 and aluminum mounting base 4, respectively. There are two example relatively larger openings 44 and 46 in the molded case 3 and the aluminum mounting base 4, respectively. Two fasteners, such as screws 48, are installed to mount a coil/motor assembly 50 (FIG. 7). This provides some degree of additional strength.

The example aluminum mounting base 4 further includes two side portions 56,57 normal to the planar portion 32. The two side portions 56,57 are disposed adjacent the molded case 3, with each of the two side portions 56,57 including the two example openings 42. The molded case 3 further includes the protrusions 40 disposed through the openings 42 of each of the two side portions 56,57 in order to mechanically interlock the two side portions 56,57 to the molded case 3 when the aluminum mounting base 4 is insert molded to the molded case 3.

EXAMPLE 6

The openings 34 of the example aluminum mounting base 4 can be a first plurality of openings 34, and the planar portion 32 can further include the second openings 46, which are larger in diameter than the first openings 34. The molded case 3 includes the corresponding relatively larger openings 44. A number of fasteners 48 couple the planar portion 32 to the molded case 3 at the number of openings 44,46.

EXAMPLE 7

The circuit interrupter 6 can be, for example and without limitation, a subminiature circuit breaker, or an aircraft or aerospace circuit breaker.

EXAMPLE 8

The disclosed molded case 3 has the insert molded aluminum mounting base 4 provided by a corresponding insert molding process as compared to prior known circuit breakers in which an aluminum base is epoxy bonded to a circuit breaker case.

EXAMPLE 9

A conventional printed circuit board (not shown) is conventionally overmolded or, otherwise, encapsulated to protect the corresponding electronics (not shown) from heat, moisture and mechanical damage. That alone, however, is not mechanically robust.

It is believed that using the disclosed molded case 3 as a mold to further encapsulate the number of PCBs 28 (FIG. 1) by using the low pressure molding material 30 (FIG. 1) is novel, reduces component count and automates production. The molded case 3 can also provide wire strain relief and the low pressure molding material 30 seals the interface between the electronics (not shown) of the PCBs 28 and the rear surface 52 (FIG. 4) of the molded case 3.

The low pressure molding material 30 can be, for example and without limitation, Macromelt 687 marketed by Henkel Corporation of Düsseldorf, Germany, or any suitable low pressure moldable polymide suitable for high humidity applications and designed to overmold electronic components.

EXAMPLE 10

The molded case 3 can be made of, for example and without limitation, Vectra® A130 LCP made by Ticona of Florence, Ky.; DuPont™ Zenite® LCP made by E. I. du Pont de Nemours and Company of Wilmington, Del.; or any suitable LCP material.

The example molded case 3 can include a plurality of threaded inserts (not shown), a molded terminal barrier (not shown) and a plurality of internal insulators (not shown). All of these structures are preferably insert molded at one time.

EXAMPLE 11

Figure 5:
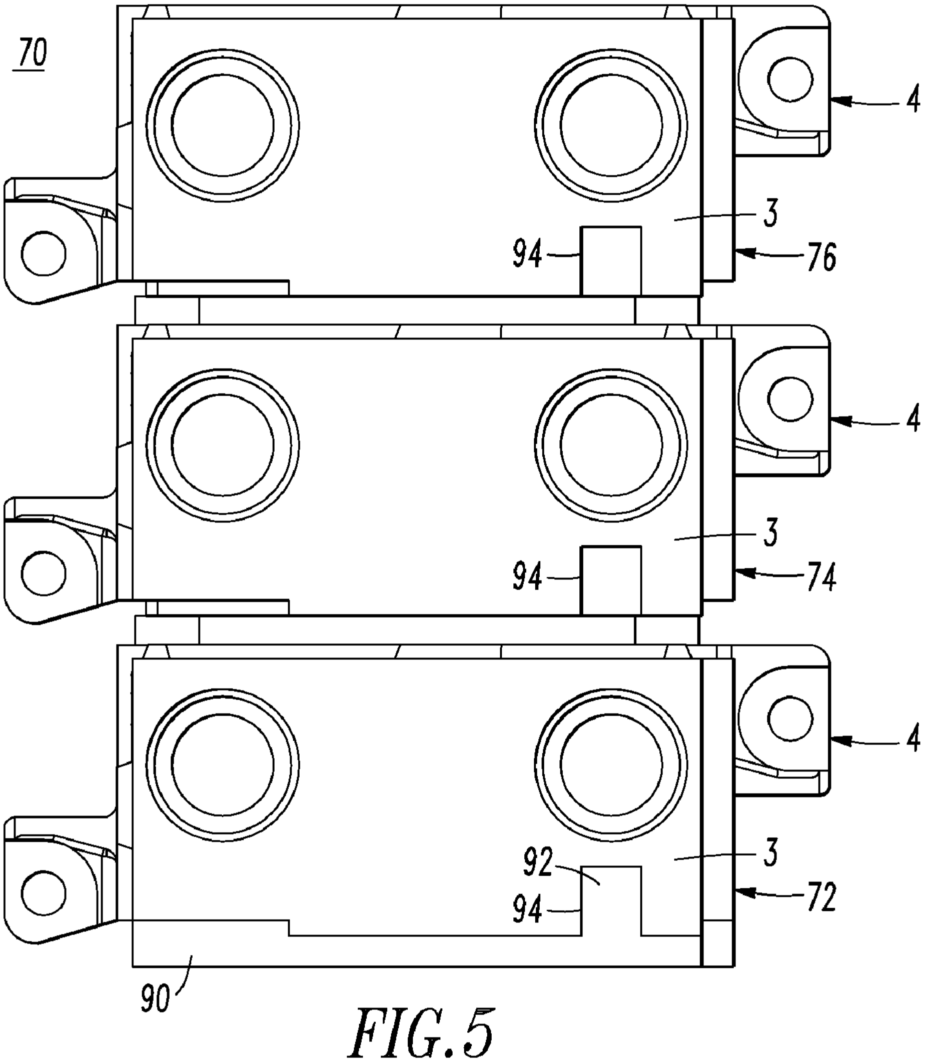
FIG. 5 is a top plan view of the three cases for the three-pole circuit interrupter of FIG. 4.
Figure 4:
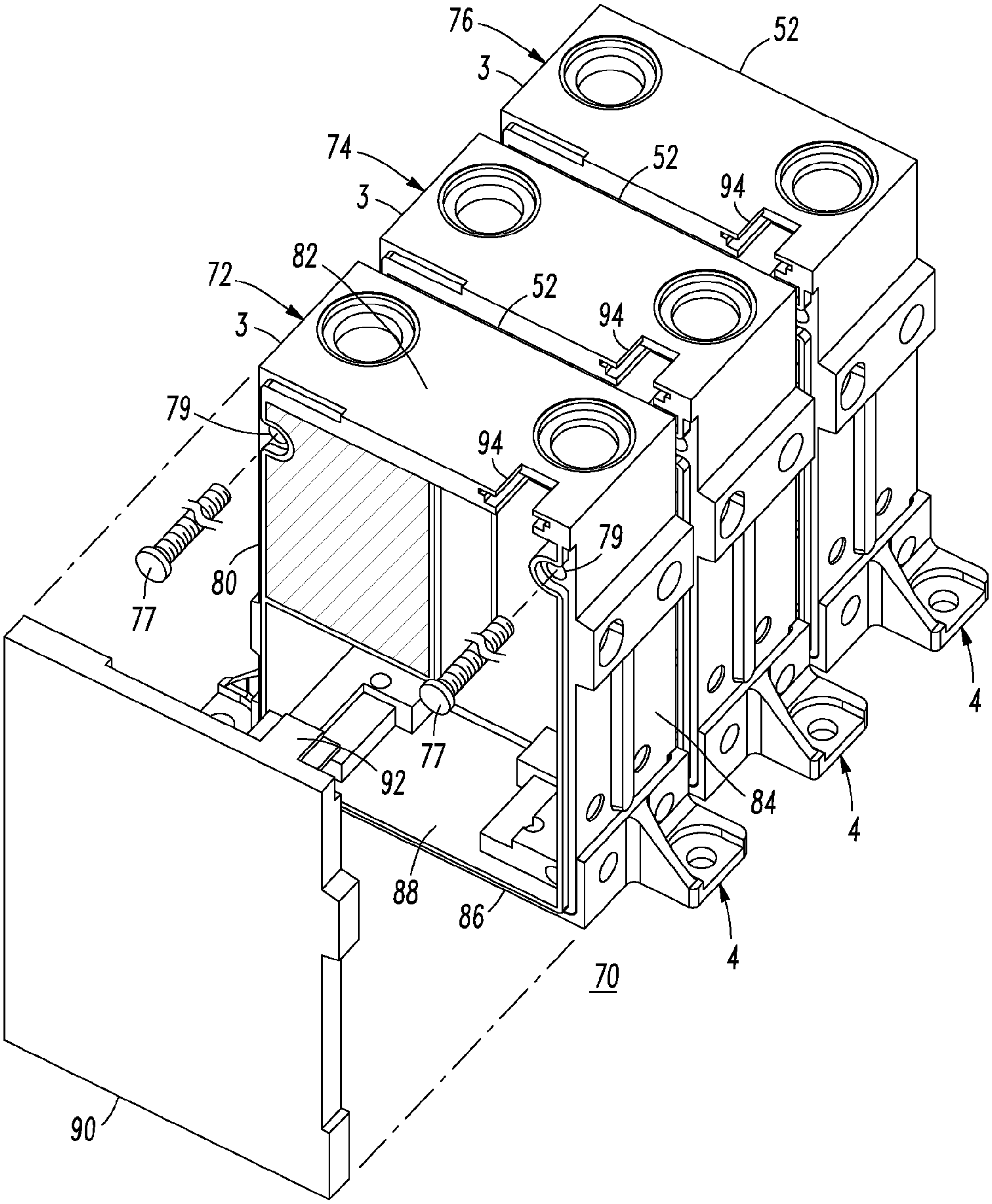
FIG. 4 is a partially exploded isometric view of three cases for a three-pole circuit interrupter including, for each pole, the liquid crystal polymer case and the aluminum mounting base of FIG. 1.
Figure 6:
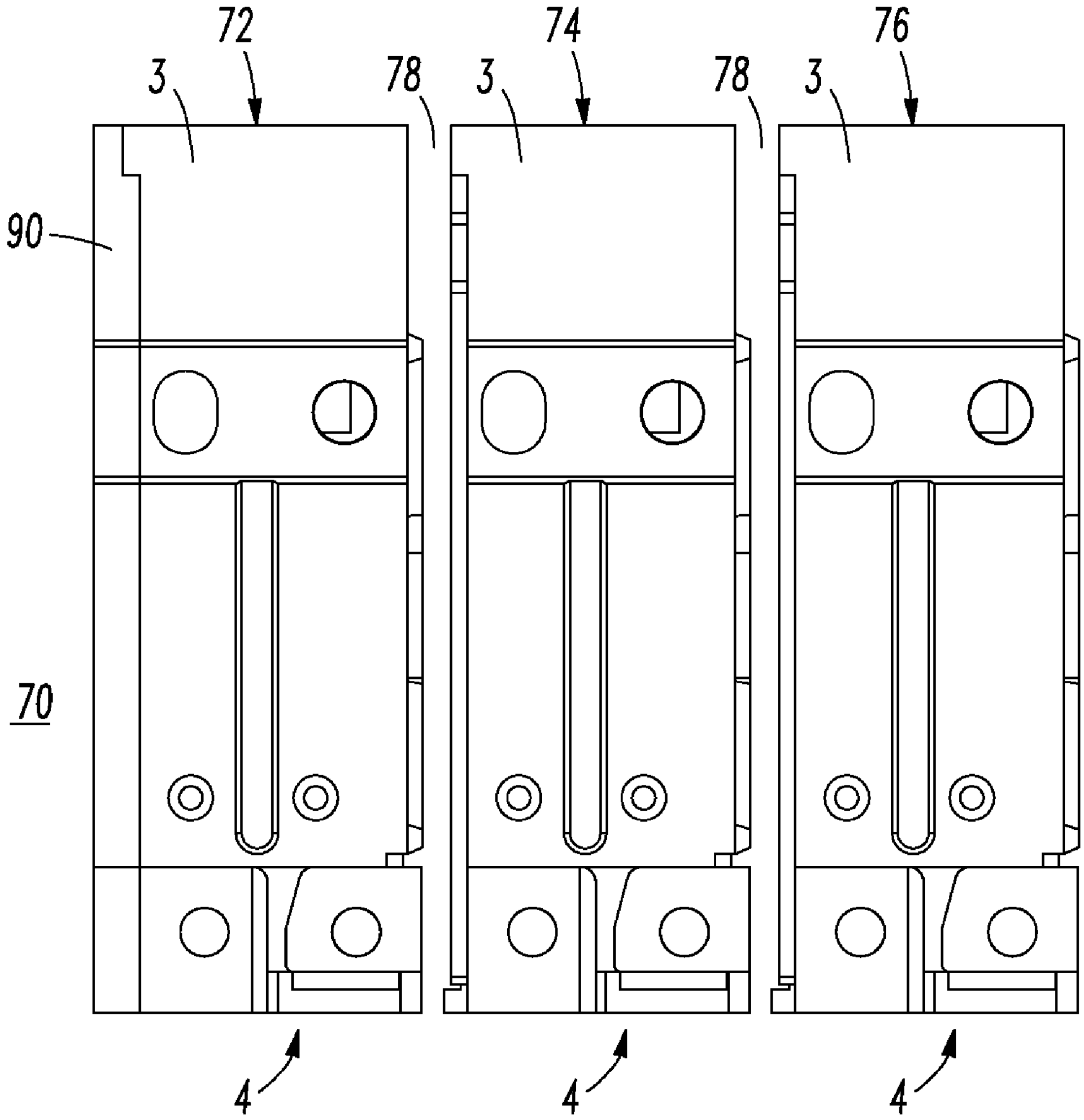
FIG. 6 is a side elevation view of the three cases for the three-pole circuit interrupter of FIG. 4.

Referring to FIGS. 4-6, a three-pole circuit interrupter 70 includes, for each of a plurality of poles 72,74,76 (three example poles are shown, although two, four or more poles can be employed), the molded case 3 and example aluminum mounting base 4 of FIGS. 1-3. A plurality of fasteners 77 (e.g., without limitation, bolts; rivets) couple the poles 72,74, 76 together. For example, a plurality of apertures 79 in each pole are employed to fasten adjacent poles together. The structure that aligns two adjacent poles together can be, for example, a spacer (not shown) with a thru hole (not shown). A counter bore (not shown) in each pole preferably provides anti-rotation and proper alignment. Preferably, the poles 72,74,76 are suitably spaced, as shown at 78 (FIG. 6), to aid in air flow and/or are configured based on installation needs.

The molded case 3 includes the back portion 52, four side portions 80,82,84,86 disposed from the back portion 52 and an open front portion 88. For each of the poles 72,74,76, a planar cover 90 is coupled to the molded case 3 at the open front portion 88. Each of the covers includes a tab 92 disposed into a corresponding tab-receiving opening 94.

EXAMPLE 12

There are five example electronics interconnect pins 68 (shown in FIG. 2) that allow the circuit interrupter 6 (FIG. 7) to be configured as a single-phase, a three-phase or another multi-circuit protection device. This provides a flexible and configurable structure. The five pins 68 include, for example, power, ground, a trip signal, and two conventional programming pins.

A multi-circuit protection device is, for example, four single-phase loads (not shown) that are opened during a fault, such as a three-phase load and a single-phase avionics load, a two-pole, a three-pole, or a four-pole DC device. Regardless whether there is a "single-phase" or one-pole circuit interrupter as opposed to a "three-phase" or three-pole circuit interrupter, there are preferably no differences between the three single-pole circuit interrupters 6 (FIG. 7). This provides manufacturing flexibility to configure the device to the customer's need.

EXAMPLE 13

As is conventional, the disclosed three-pole RCCB or three-pole RPC 70 includes an intelligent interconnect between individual poles 72,74,76. This trips all poles/phases when a thermal overload is detected on any pole or phase.

EXAMPLE 14

The RCCB or RPC 70 is a combination relay and circuit breaker, which can be tripped or set by applying a trip or set coil pulse current. The RCCB is preferably used in conjunction with an indicator control unit (ICU) (e.g., without limitation, a one-half ampere, fast trip, push-pull, thermal circuit breaker) (not shown). With the ICU closed, and power available to a line terminal (not shown), the RCCB assumes a set (closed) state. The RCCB assumes a trip (open) state if the ICU is open. If power is removed from the RCCB, then it will remain in the same state it was in prior to power removal. When power is reapplied, the RCCB will assume the state dictated by the ICU. With the RCCB closed, an overload or fault current (e.g., without limitation, 138% or greater of rated current), will cause the RCCB to trip within the time limits of an applicable trip time curve, and, in turn, cause a controlled overloading of the ICU, causing it to trip also. The ICU provides indication that the RCCB has opened. The ICU opens and reconnects before the RCCB can be reset.

EXAMPLE 15

The disclosed molded case 3, which is made of LCP, provides superior moisture resistance characteristics as contrasted with thermoset compounds, which are believed to be notorious for varying dielectric characteristics based on post-bake temperatures and times. The molded case 3 is stronger from an installation standpoint, lighter, and far more repeatable from an environmental or dielectric withstand capability. The molded case 3 also reduces terminal torque out failures since LCP is about ten times stronger in tensile than thermoset compounds.

EXAMPLE 16

The disclosed molded case 3 and the insert molded aluminum mounting base 4 provide various improvements in circuit interrupters and are believed to be a departure from known prior technology. For example, the use of LCP permits: (1) molding relatively very thin walls, such as 26 (FIG. 1), to improve the packaging of electronics (e.g., reducing wall sections and insert molding components together provides metal-like strength with weights being up to 50% less, since LCP is about ten times stronger than thermoset); (2) molding relatively thicker sections or solid bases as employed to attach the example aluminum mounting base 4 without compromising strength or without resulting in non-filled plastic areas; and (3) essentially no moisture absorption compared to thermoset and seal and vented designs.

EXAMPLE 17

The disclosed circuit interrupter 6 is preferably sealed and vented. For example, all covers are gasketed or bonded for the seal. A vent tube (not shown) with a relatively very small hole is place on the side of the circuit interrupter 6 facing "down" when installed. This allows for an internal expansion during electrical overloads or pressure differences, and drives/pushes moisture out of the circuit interrupter 6 during normal operation.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:

a housing comprising a molded case made of liquid crystal polymer;

separable contacts disposed within said housing;

an operating mechanism disposed within said housing and being structured to open and close said separable contacts; and a trip mechanism disposed within said housing and being structured to cooperate with said operating mechanism to trip open said separable contacts, said trip mechanism comprising an electronic trip circuit and a rigid, conductive base providing an aircraft chassis ground to said electronic trip circuit, wherein said rigid, conductive base is insert molded to a portion of said molded case, wherein said molded case includes a first cavity, a separate second cavity and a wall separating said first cavity from said separate second cavity;

wherein said separable contacts and said operating mechanism are disposed within said separate second cavity; and wherein said electronic trip circuit comprises a number of printed circuit boards disposed within said first cavity, wherein said first cavity is structured as a mold and receives said number of printed circuit boards and a low pressure molding material to encapsulate said number of printed circuit boards within said first cavity, wherein said molded case further includes a back portion, four side portions disposed from said back portion and an open front portion, and wherein a planar cover is coupled to said molded case at the open front portion to cover, within a single volume enclosed by said molded case and said planar cover and including said first cavity and said separate second cavity, both of said encapsulated number of printed circuit boards within said first cavity, and said separable contacts and said operating mechanism disposed within said separate second cavity.

2. The circuit interrupter of claim 1 wherein said rigid, conductive base is made of aluminum.

3. The circuit interrupter of claim 1 wherein said rigid, conductive base is about 2.25 inches, by about 1.125 inches, by about 0.625 inches in size.

4. The circuit interrupter of claim 1 wherein said circuit interrupter is a circuit breaker.

5. The circuit interrupter of claim 1 wherein said circuit interrupter is a remote control circuit breaker.

6. The circuit interrupter of claim 1 wherein said circuit interrupter is a subminiature circuit breaker.

7. The circuit interrupter of claim 1 wherein said circuit interrupter is an aircraft or aerospace circuit breaker.

8. The circuit interrupter of claim 1 wherein said circuit interrupter is a remote power controller.

9. The circuit interrupter of claim 1 wherein said low pressure molding material is a low pressure moldable polymide.

10. A circuit interrupter comprising:

a housing comprising a molded case made of liquid crystal polymer;

separable contacts disposed within said housing;

an operating mechanism disposed within said housing and being structured to open and close said separable contacts; and a trip mechanism disposed within said housing and being structured to cooperate with said operating mechanism to trip open said separable contacts, said trip mechanism comprising an electronic trip circuit and a rigid, conductive base providing an aircraft chassis ground to said electronic trip circuit, wherein said rigid, conductive base is insert molded to a portion of said molded case, and wherein said rigid, conductive base includes a planar portion disposed adjacent said molded case, said planar portion including a plurality of openings, said molded case including a plurality of protrusions disposed through said plurality of openings, in order to mechanically interlock said planar portion to said molded case when said rigid, conductive base is insert molded to the portion of said molded case.

11. The circuit interrupter of claim 10 wherein the plurality of protrusions of said molded case are disposed in a plurality of first rows, with each of said first rows including a plurality of said plurality of protrusions; and wherein the plurality of openings of said planar portion are disposed in a plurality of second rows, with each of said second rows including a plurality of said plurality of openings.

12. The circuit interrupter of claim 10 wherein said rigid, conductive base further includes two side portions normal to said planar portion, said two side portions being disposed adjacent said molded case, each of said two side portions including a plurality of openings, said molded case including a plurality of protrusions disposed through the plurality of openings of each of said two side portions, in order to mechanically interlock said two side portions to said molded case when said rigid, conductive base is insert molded to said molded case.

13. The circuit interrupter of claim 10 wherein said plurality of openings are a first plurality of openings; wherein said planar portion further includes a number of second openings, said number of second openings being larger in diameter than said first plurality of openings; wherein said molded case includes a number of third openings; and wherein a number of fasteners couple said planar portion to said molded case at said number of second openings and said number of third openings.

14. A circuit interrupter comprising:

a housing comprising a molded case made of liquid crystal polymer, said molded case including a first cavity, a separate second cavity and a wall separating said first cavity from said separate second cavity;

separable contacts disposed within said separate second cavity;

an operating mechanism disposed within said separate second cavity and being structured to open and close said separable contacts; and a trip mechanism disposed within said housing and being structured to cooperate with said operating mechanism to trip open said separable contacts, said trip mechanism comprising a number of printed circuit boards disposed within said first cavity, wherein said first cavity is structured as a mold and receives said number of printed circuit boards and a low pressure molding material to encapsulate said number of printed circuit boards within said first cavity, wherein said molded case further includes a back portion, four side portions disposed from said back portion and an open front portion, and wherein a planar cover is coupled to said molded case at the open front portion to cover, within a single volume enclosed by said molded case and said planar cover and including said first cavity and said separate second cavity, both of said encapsulated number of printed circuit boards within said first cavity, and said separable contacts and said operating mechanism disposed within said separate second cavity.

15. The circuit interrupter of claim 14 wherein said low pressure molding material is a low pressure moldable polymide.

16. The circuit interrupter of claim 14 wherein said circuit interrupter is a circuit breaker.

17. The circuit interrupter of claim 14 wherein said circuit interrupter is a remote power controller.

18. A circuit interrupter comprising:

a plurality of poles, each of said poles comprising:

a housing comprising a molded case made of liquid crystal polymer separable contacts disposed within said housing, an operating mechanism disposed within said housing and being structured to open and close said separable contacts, and a trip mechanism disposed within said housing and being structured to cooperate with said operating mechanism to trip open said separable contacts, said trip mechanism comprising an electronic trip circuit and a rigid, conductive base providing an aircraft chassis ground to said electronic trip circuit, wherein said rigid, conductive base is insert molded to a portion of said molded case; and a plurality of fasteners coupling said plurality of poles together, wherein said molded case comprises a first cavity, a separate second cavity, a wall separating said first cavity from said separate second cavity, a back portion, four side portions disposed from said back portion and an open front portion; wherein said separable contacts and said operating mechanism are disposed within said separate second cavity; wherein said electronic trip circuit comprises a number of printed circuit boards disposed within said first cavity; and wherein a planar cover is coupled to said molded case at the open front portion to cover, within a single volume enclosed by said molded case and said planar cover and including said first cavity and said separate second cavity, both of said number of printed circuit boards disposed within said first cavity, and said separable contacts and said operating mechanism disposed within said separate second cavity.

* * * * *